United States Patent
Folberth et al.

(10) Patent No.: US 9,384,316 B2
(45) Date of Patent: Jul. 5, 2016

(54) PATH-BASED CONGESTION REDUCTION IN INTEGRATED CIRCUIT ROUTING

(71) Applicant: International Business Machines Corporation, Armonk, NY (US)

(72) Inventors: Harald Folberth, Boeblingen (DE); Sven Peyer, Tuebingen (DE); Sourav Saha, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 14/326,832

(22) Filed: Jul. 9, 2014

(65) Prior Publication Data

US 2016/0012172 A1  Jan. 14, 2016

(51) Int. Cl.
G06F 9/455 (2006.01)
G06F 17/50 (2006.01)

(52) U.S. Cl.
CPC ........ G06F 17/5077 (2013.01); G06F 17/5081 (2013.01)

(58) Field of Classification Search
USPC .......................................................... 716/134
See application file for complete search history.

(56) References Cited

U.S. PATENT DOCUMENTS

| 7,185,305 | B1 * | 2/2007 | Rodman ............. G06F 17/5068 716/127 |
| 7,313,776 | B2 | 12/2007 | Kaul et al. | |
| 7,636,876 | B1 * | 12/2009 | Srinivasan .......... G06F 17/5072 714/701 |
| 7,689,964 | B2 | 3/2010 | Zarkesh-Ha et al. | |
| 7,895,557 | B2 | 2/2011 | Alpert et al. | |
| 8,230,378 | B2 | 7/2012 | Cohn et al. | |
| 8,370,783 | B2 | 2/2013 | Uchino et al. | |
| 8,443,324 | B2 | 5/2013 | Alpert et al. | |
| 8,543,964 | B2 | 9/2013 | Ge et al. | |
| 2015/0113493 | A1 * | 4/2015 | Lin et al. ....................... 716/120 |

OTHER PUBLICATIONS

Hu et al., "A Timing-Constrained Simultaneous Global Routing Algorithm", IEEE Transactions on Computer-Aided Design of Integrated Circuits and Systems, vol. 21, No. 9, Sep. 2002, pp. 1025-1036, © 2002 IEEE.

Wei et al., "Catalyst: Planning Layer Directives for Effective Design Closure", DATE '13 Proceedings of the Conference on Design, Automation and Test in Europe, pp. 1873-1878, © 2013 EDAA.

* cited by examiner

*Primary Examiner* — Eric Lee
(74) *Attorney, Agent, or Firm* — Noah A. Sharkan (57) ABSTRACT

According to one embodiment of the present invention, a method for reducing congestion in an integrated circuit design is provided. The method may include identifying a net, wherein the net defines a path on one or more of a plurality of conducting layers in an integrated circuit and the net has an associated signal transit time. The method may further include identifying a first subnet of the net in a congested area of the integrated circuit. The method may further include modifying the first subnet, such that the congested area becomes less congested. The method may further include identifying a second subnet of the net in an uncongested area of the integrated circuit. The method may further include modifying the second subnet, such that the signal transit time of the net decreases.

17 Claims, 5 Drawing Sheets

PATH-BASED CONGESTION REDUCTION IN INTEGRATED CIRCUIT ROUTING

BACKGROUND OF THE INVENTION

The present invention relates generally to the field of integrated circuit (IC) physical design, and more particularly to circuit element congestion reduction.

During the physical design stage of integrated circuit design, electronic design automation (EDA) tools place and optimize the electrical components and interconnections planned during the logical design phase. EDA tools generate possible locations for the electrical components based on various factors including the size of the circuit, the locations of various child blocks within a parent block, and timing requirements. Once placement completes, a global routing tool, which may be a function of the EDA tool, generates a layout for the electrical interconnections (nets) that complete the circuit by connecting all of the electrical components according to the logical design of the circuit.

Each net in the circuit follows a path through one or more conducting layers in the IC design. Nets can be modified in order to satisfy functional requirements of the circuit design, such as timing requirements. One method of modifying the nets is to "promote" or "demote" the net, or a subnet of the net. When a net is promoted or demoted, the net is physically relocated from one layer to another in a stack of conducting layers on which the nets are formed. Different layers allow for different signal transmission times in the wires. Typically, higher layers allow for faster signal transit times and lower layers allow for slower signal transit times. Another method of changing signal transit times is by modifying the width, or "wire-code" of the net. In this method, the cross-sectional area of the net is increased or decreased to allow for faster or slower signal transit times, respectively. As used herein, the term "slack" refers to the difference between the required signal transit time and the actual signal transit time (as specified in the functional requirements of the circuit design).

SUMMARY

According to one embodiment of the present invention, a method for reducing congestion in an integrated circuit design is provided. The method may include identifying a net, wherein the net defines a path on one or more of a plurality of conducting layers in an integrated circuit, and the net has an associated signal transit time that depends, at least in part, on the path defined by the net. The method may further include identifying a first subnet of the net in a congested area of the integrated circuit, wherein the first subnet has a first wire width and lies on a first conducting layer of the integrated circuit. The method may further include modifying the first subnet, such that the congested area becomes less congested. The method may further include identifying a second subnet of the net in an uncongested area of the integrated circuit, wherein the second subnet has a second wire width and lies on a second conducting layer of the integrated circuit. The method may further include modifying the second subnet, such that the signal transit time of the net decreases.

According to another embodiment, a computer program product for reducing congestion in an integrated circuit design is provided. The computer program product may include one or more computer-readable storage media and program instructions stored on the one or more computer-readable storage media. The program instructions may include program instructions to identify a net, wherein the net defines a path on one or more of a plurality of conducting layers in an integrated circuit, and the net has an associated signal transit time that depends, at least in part, on the path defined by the net. The program instructions may further include program instructions to identify a first subnet of the net in a congested area of the integrated circuit, wherein the first subnet has a first wire width and lies on a first conducting layer of the integrated circuit. The program instructions may further include program instructions to modify the first subnet, such that the congested area becomes less congested. The program instructions may further include program instructions to identify a second subnet of the net in an uncongested area of the integrated circuit, wherein the second subnet has a second wire width and lies on a second conducting layer of the integrated circuit. The program instructions may further include program instructions to modify the second subnet, such that the signal transit time of the net decreases.

According to another embodiment, a computer system for reducing congestion in an integrated circuit design is provided. The computer system may include one or more computer processors. The computer system may further include one or more computer-readable storage media. The computer system may further include program instructions stored on the computer-readable storage media for execution by at least one of the one or more processors. The program instructions may include program instructions to identify a net, wherein the net defines a path on one or more of a plurality of conducting layers in an integrated circuit, and the net has an associated signal transit time that depends, at least in part, on the path defined by the net. The program instructions may further include program instructions to identify a first subnet of the net in a congested area of the integrated circuit, wherein the first subnet has a first wire width and lies on a first conducting layer of the integrated circuit. The program instructions may further include program instructions to modify the first subnet, such that the congested area becomes less congested. The program instructions may further include program instructions to identify a second subnet of the net in an uncongested area of the integrated circuit, wherein the second subnet has a second wire width and lies on a second conducting layer of the integrated circuit. The program instructions may further include program instructions to modify the second subnet, such that the signal transit time of the net decreases.

DETAILED DESCRIPTION

Embodiments of the present invention recognize that global routing algorithms and modification techniques, such as promotion/demotion and wire-code increasing/decreasing to meet timing requirements, can sometimes lead to congestion issues in the physical design. Congestion occurs when not enough space exists in a given region to accommodate all of the circuit elements and nets in that space. For example, if a given region of the IC can accommodate 100 nets, but the EDA tool determines a design in which 120 nets pass through the region, then that particular region is considered "congested" and modifications must be made to the design in order to eliminate the congestion. Embodiments of the present invention disclose a means for reducing congestion in an IC design by considering path based wire-code adjustments and promotion/demotion.

Figure 1:
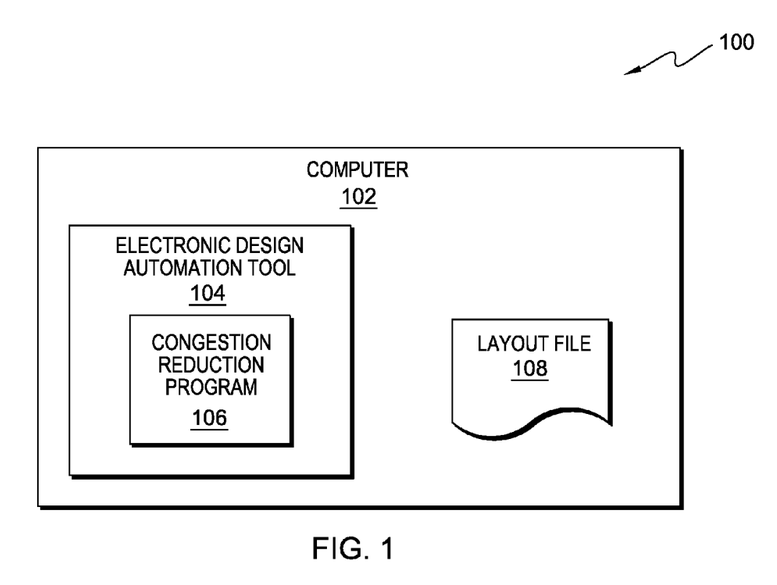
FIG. 1 is a functional block diagram illustrating a physical design computing environment, in accordance with an embodiment of the present invention.

Embodiments of the present invention will now be described in detail with reference to the Figures. FIG. 1 is a functional block diagram illustrating a physical design computing environment (environment), generally designated 100, in accordance with an exemplary embodiment of the present invention. Environment 100 includes computer 102.

In various embodiments, computer 102 can be a desktop computer, a laptop computer, a tablet computer, a specialized computer server, a smartphone, or any other computer system known in the art. In certain embodiments, computer 102 represents a computer system utilizing clustered computers and components that act as a single pool of seamless resources when accessed over a network (not shown), as is common in data centers and with cloud computing applications. In general, computer 102 is representative of any programmable electronic device or combination of programmable electronic devices capable of executing machine-readable program instructions. Exemplary components of computer 102 are described in greater detail with respect to FIG. 5. Computer 102 includes EDA tool 104 and layout file 108.

EDA tool 104 is a software tool that enables physical design engineers to design and modify IC circuits. In various embodiments, EDA tool 104 can be a software tool that can be used to run synthesis, placement, and optimization operations on logical netlists. In general, EDA tool 104 may be implemented with any tool that, in conjunction with congestion reduction program 106, is capable of accessing a layout file of an integrated circuit design and performing congestion analysis and timing analysis on the IC described by layout file 108, in accordance with embodiments of the present invention. EDA tool 104 includes congestion reduction program 106.

Congestion reduction program 106 is a software tool that analyzes a layout file that describes the physical layout of an IC design and identifies and rectifies congestion issues within the layout file. Specifically, congestion reduction program 106 identifies congested tiles in layout file 106, decreases the congestion within the tile by sacrificing signal transit time on one or more nets in the congested tile, and compensates for this sacrifice in other locations along the net which pass through uncongested tiles.

Layout file 108 is a model of an IC which describes the physical location of the electrical components and nets in the IC. In the exemplary embodiment, layout file 108 describes the locations of the electrical components following a synthesis, placement, and optimization operation by EDA tool 104. In this embodiment, layout file 108 includes global routing information for the nets in the IC and a three-dimensional description of an IC design. The description of the IC design can include multiple layers, which represent stacked layers of conductors and circuit elements. Nets can travel from lower layers to higher layers, and vice versa. In typical IC designs, "higher" layers allow for faster signal transfer; therefore, promoting a net to a higher layer improves signal transit time.

Within layout file 108, each layer can be divided into one or more two dimensional tiles which represent the physical surface of the layer on which electrical components can be formed. Because each tile has a finite amount of area, a balancing must take place in order to ensure that the space consumed by the components in the tile is not greater than the area of the tile. If the area of the components is greater than the area of the tile, then the tile is congested, and the physical attributes of the components must be modified (e.g., by decreasing wire-code of the nets) or some of the components and/or nets must be moved to different tiles in order to generate a physically plausible design.

Figure 2:
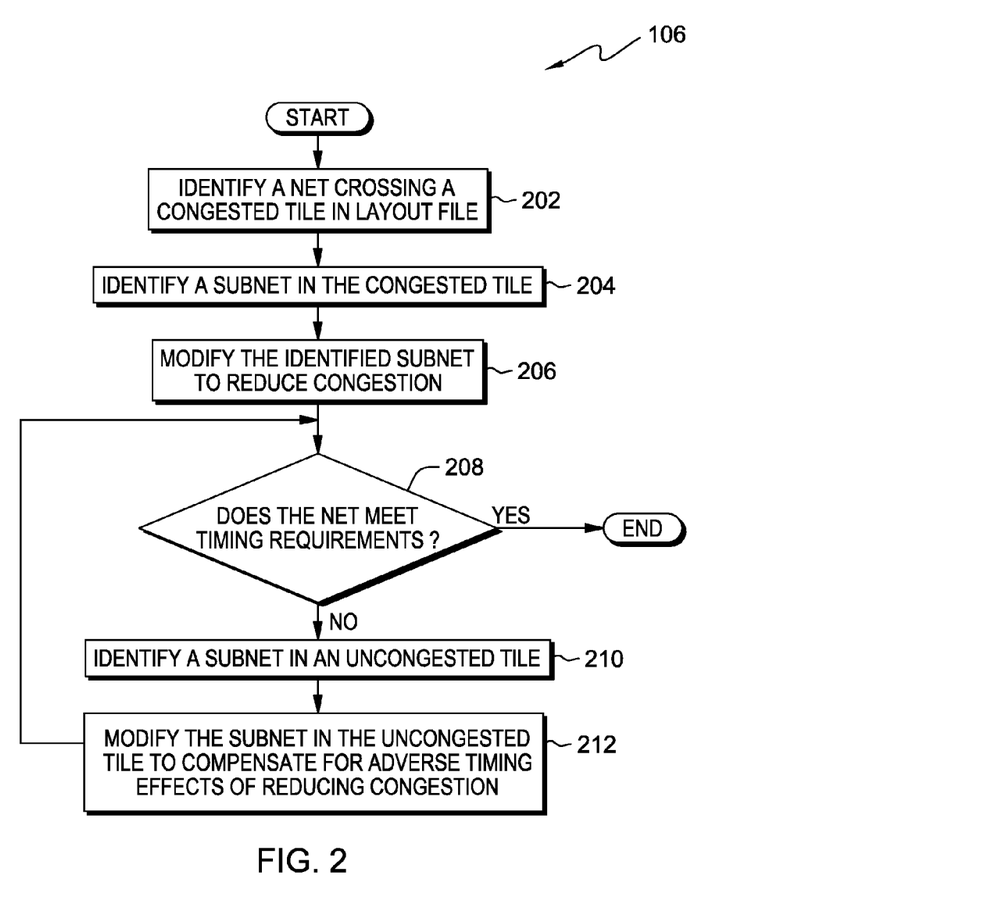
FIG. 2 is a flowchart depicting operational steps of a congestion reduction program, on a computer within the environment of FIG. 1, in accordance with an embodiment of the present invention.

FIG. 2 is a flowchart depicting operational steps of congestion reduction program 106, on computer 102 within the environment of FIG. 1, in accordance with an embodiment of the present invention. In various embodiments, congestion reduction program 106 can access and modify the information in layout file 108, including the tile and layer information, in order to generate a layout which reduces congestion which may have been generated during the placement and routing stages of design.

Congestion reduction program 106 identifies a net crossing a congested tile in layout file 108 (step 202). In the exemplary embodiment of FIG. 2, congestion reduction program 106 accesses layout file 108, on which a congestion analysis can be run, in order to identify congested tiles and nets which cross those congested tiles. In this embodiment, congestion reduction program 106 instructs EDA tool 104 to perform congestion analysis, which analyzes the placement and routing in the IC design described by layout file 108. The congestion analysis tool can divide the layers in layout file 108 into tiles and determine whether the tiles are congested based on the size of the physical components and nets that exist within the tile. In this embodiment, congestion reduction program 106 can access the results of the congestion analysis in order to identify a net which crosses a congested tile. Each net in the IC design described by layout file 108 has a unique identifier which allows congestion reduction program 106 to identify the net by name.

Congestion reduction program 106 identifies a subnet in the congested tile (step 204). In the exemplary embodiment, the identified net is made up of one or more subnets which ultimately connect a signal source in the IC design with a signal sink. Subnets may be defined by, for example, the source and the sink, along with turns in the net connecting source and sink, or intermediate electrical components, such as buffers, that the net encounters between the source and the sink. In this embodiment, congestion reduction program 106 identifies a subnet that crosses the congested tile. The subnet can lie entirely within the congested tile or partially within the congested tile. In various embodiments, the subnet can originate or terminate within the congested tile, but extend into neighboring tiles. Alternatively, the subnet can commence and terminate in neighboring tiles, but pass through the congested tile in between.

Congestion reduction program 106 modifies the identified subnet such that the congestion within the tile is reduced and the overall signal transit time on the net is increased (step 206). In this exemplary embodiment, congestion reduction program 106 sacrifices signal transit time in the local area where congestion occurs. Congestion reduction program 106 alters the wire-code (width) of the subnet, demotes the wire to a lower layer, thereby removing the subnet from the congested tile, or both. In this embodiment, congestion reduction program 106 can reduce the wire-code of the subnet with little to no effect on the electrical behavior of neighboring nets and electrical components. Congestion reduction program 106 can reduce the wire-code of the subnet within the limits of the IC design. In the exemplary embodiment, congestion reduction program 106 demotes the subnet only when the demotion will not result in congestion on the lower layer. In alternative embodiments, congestion reduction program can demote the identified subnet even if it creates or increases congestion at the lower layer, so long as the newly created or increased congestion on the lower layer is addressed at a later time. In yet other embodiments, congestion reduction program 106 may make other modifications to the identified subnet to decrease congestion in the tile and increase the overall signal transit time on the net.

Congestion reduction program 106 determines whether the modified net meets timing requirements specified by a user as part of the IC design specifications (decision block 208). Because wire-code reduction and subnet layer demotion usually result in a slower overall signal transit time on the net, congestion reduction program 106 checks the signal transit time in order to determine whether the modified net meets the timing requirements of the circuit. In the exemplary embodiment, congestion reduction program 106 performs an incremental timing analysis on the net to which the modified subnet belongs. Incremental timing analysis allows the congestion reduction program 106 to perform a timing analysis on a select portion of the IC design rather than expending the time and resources to run a full timing analysis on the entire design. In this embodiment, congestion reduction program 106 compares the time a signal actually takes to traverse the net, as determined by incremental timing analysis, with the specified timing requirements (i.e., the maximum allowable time allowed for the net according to the IC design specifications) to determine whether the modified net meets the specified timing requirements. If congestion reduction program 106 determines that the modified net meets the timing requirements (decision block 208, YES branch), then congestion reduction program 106 terminates execution for the identified net.

If congestion reduction program 106 determines that the net does not meet the timing requirements (decision block 208, NO branch), then congestion reduction program 106 identifies a subnet in an uncongested tile (step 210). In the exemplary embodiment, congestion reduction program 106 accesses layout file 106 to identify a subnet of the identified net that is not located in the congested tile and passes through an uncongested tile. In the exemplary embodiment, the subnet identified in step 210 lies completely in an uncongested tile. In alternative embodiments, this subnet can lie partially within congested tiles so long as any adverse congestion effects are rectified.

Congestion reduction program 106 modifies the identified subnet in the uncongested tile to compensate for the adverse timing effects of decreasing congestion (i.e., increased signal transit time) (step 212). In the exemplary embodiment, congestion reduction program 106 performs at least one of increasing wire-code and promoting the subnet in the uncongested tile to a higher layer. By increasing the wire-code of the subnet in the congested tile, congestion reduction program increases the width of the subnet and, therefore, usually decreases the signal transit time. By promoting the subnet to a higher level, the signal transit time is also usually decreased. The increase in wire-code and/or promotion of the subnet allows for congestion reduction program 106 to compensate for any timing sacrifices made in step 206 as a result of reducing the congestion in the congested tile. In other embodiments, congestion reduction program 106 uses other means known in the art to decrease the signal transit time of the subnet in the uncongested tile in order to improve the signal transit time on the entire net. After modifying the subnet in the uncongested tile to compensate for adverse timing effects of decreasing the congestion in the congested tile, congestion reduction program 106 determines whether the net meets the timing requirements of the IC design (decision block 208), as previously discussed.

Figure 3:
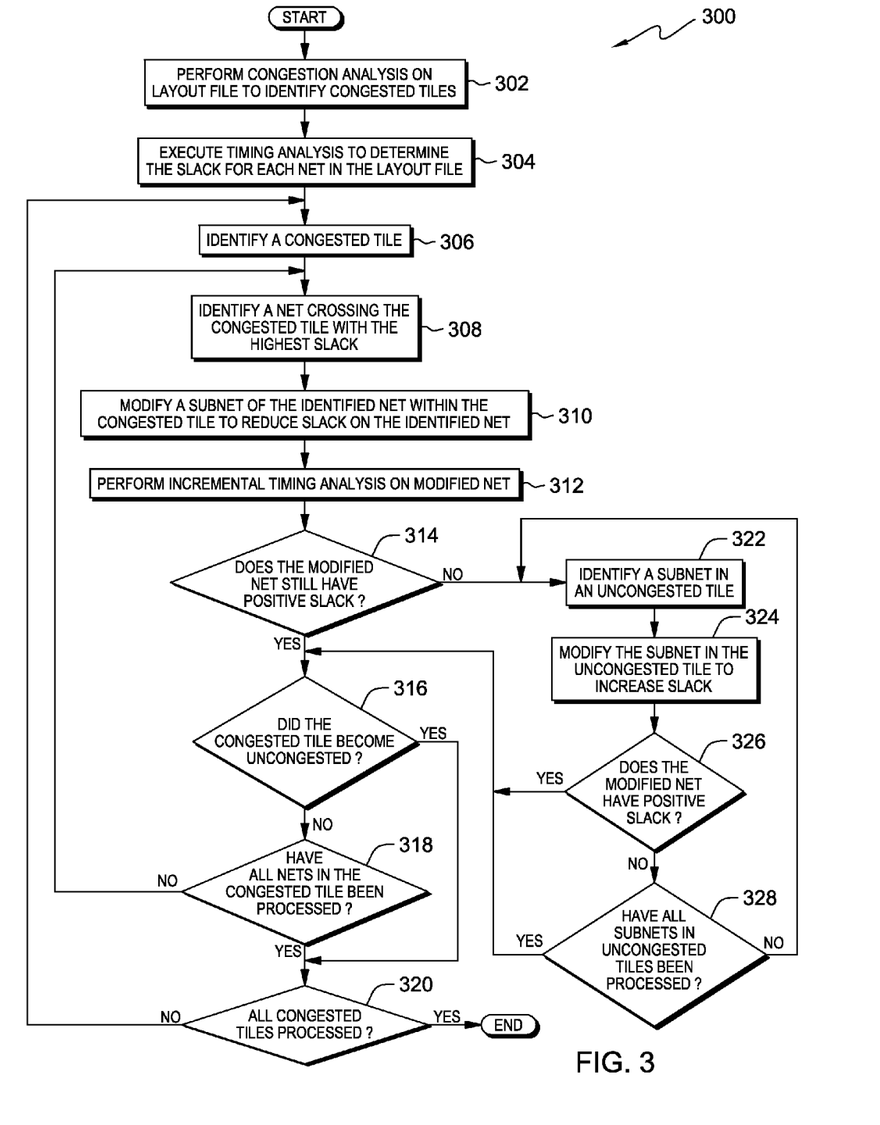
FIG. 3 is a flowchart depicting operational steps of a congestion reduction program, in accordance with an embodiment of the present invention.

FIG. 3 is a flowchart depicting operational steps of a congestion reduction program, generally designated 300, in accordance with an illustrative embodiment of the present invention. The embodiment described with respect to FIG. 3 differs from the embodiment of FIG. 1 only with respect to using congestion reduction program 300 rather than congestion reduction program 106.

Congestion reduction program 300 performs a congestion analysis on layout file 108 to identify congested tiles (step 302). In the illustrative embodiment, congestion reduction program 300 performs a congestion analysis in order to generate a list of congested regions within the IC described in layout file 108. Congestion analysis divides each layer of the IC design described in layout file 108 into one or more tiles. Each tile has a specified area. Based on the area of the tile and the electronic components placed inside the tile during the placement and global routing stages of the physical design process, the congestion analysis tool can identify one or more tiles that are congested (i.e., have a greater area of components than physical space allowed in the tile). In the illustrative embodiment, the congestion analysis conducted by congestion reduction program 300 results in a list of specific tiles that are congested.

Congestion reduction program 300 executes a timing analysis to determine the slack for each net in the layout file (step 304). In the illustrative embodiment, congestion reduction program 300 performs a timing analysis on the complete IC described in layout file 108 using tools available in a typical EDA tool (e.g., EDA tool 104). Timing analysis features compute the time required for a signal to traverse each net in the IC from the signal source to the signal sink. The actual signal transit time for each net can be compared to the required signal transit time defined in the IC design specifications (by a predefined, target value for the signal transit time), which describe the critical components and operation of the IC. In the illustrative embodiment, congestion reduction program 300 determines the difference between the required signal transit time defined by the IC design specifications and the actual signal time determined by the timing analysis. In the illustrative embodiment, a positive slack means that the signal takes less time to traverse the net than required by the IC design specifications. A negative slack indicates that the signal takes more time to traverse the net than allowed by the IC design specifications. In various embodiments, negative slack on one or more nets could mean that the IC does not function as intended and can lead to problems in the circuit's performance. Congestion reduction program 300 uses the timing analysis information to determine the slack on each net in the IC described by layout file 108.

Congestion reduction program 300 identifies a congested tile (step 306). In the illustrative embodiment, congestion reduction program 300 sorts the list of congested tiles generated by the congestion analysis tool in order to identify the most congested tile that has not already been processed by congestion reduction program 300. The most congested tile is the tile with the most components and nets in the tile above the amount allowed by the tile area.

Congestion reduction program 300 identifies a net crossing the identified tile that has the greatest (i.e., most positive) slack (step 308). In the illustrative embodiment, congestion reduction program 300 iterates through each net crossing the identified tile by name and accesses the list of nets generated by the timing analysis in step 304 in order to rank the nets in the identified tile from those with the greatest slack to those with the least slack. In this embodiment, congestion reduction program 300 identifies the net crossing the identified tile that has the greatest slack that has not already been processed by congestion reduction program 300. In various embodiments, congestion reduction program 300 operates only on nets crossing the congested tile that have positive slack (i.e., nets where the actual signal transit time is less than the required signal transit time).

Congestion reduction program 300 modifies a subnet of the identified net which crosses the congested tile to decrease the slack on the identified net (step 310). In the illustrative embodiment, congestion reduction program 300 identifies a subnet of the identified net that crosses the identified tile. In this embodiment, congestion reduction program 300 modifies the identified subnet (and, therefore, modifies the identified net to create a modified net) by, for example, decreasing the wire-code of the identified subnet (i.e., making the net thinner) and/or demoting the identified subnet to a lower layer. Decreasing the wire-code and demoting the subnet result in slower signal transit time across the net from source to sink, so the slack on the net also decreases as a result of the modification. In this embodiment, congestion reduction program 110 demotes the identified subnet only if the demotion will not result in creating or further congesting a congested tile on the lower layer. In other embodiments, congestion reduction program 300 can demote the identified subnet regardless of the effect on the lower layer so long as all congested tiles in the IC are processed prior to completing the design. In other embodiments, congestion reduction program 300 uses other means known in the art to that decreases the congestion in the identified tile and decreases the slack on the identified net.

Congestion reduction program 300 performs incremental timing analysis on the modified net (step 312). In the illustrative embodiment, congestion reduction program 300 performs a standard incremental timing analysis. In other embodiments, congestion reduction program 300 instructs EDA tool 104 to perform incremental timing analysis on the modified net using tools within EDA tool 104 to determine the signal transit time on the modified net. As discussed above, incremental timing analysis allows the EDA tool to perform timing analysis on only one net, or a small set of nets, in order to avoid expending the time and resources necessary to perform a complete timing analysis on the IC design.

Congestion reduction program 300 determines whether the modified net still has positive slack (decision block 314). In the illustrative embodiment, compares the results of the incremental timing analysis on the modified net with the timing requirements for the identified net in the IC design specifications to determine the slack on the net. As discussed above, slack is the actual transit time of a signal on the net subtracted from the signal transit time required by the IC design. If congestion reduction program 300 determines that the modified net does not have positive slack (decision block 314, NO branch), then congestion reduction program 300 identifies a subnet of the modified net that is in an uncongested tile (step 322) (discussed in further detail below).

If the slack on the modified net is positive (i.e., the modified net meets the timing requirements of the IC design) (decision block 314, YES branch), then congestion reduction program 300 determines whether the identified congested tile became uncongested (decision block 316). In the illustrative embodiment, congestion reduction program 300 performs a congestion analysis using EDA tool 104 in order to determine if the identified tile is still congested following the modifications to the identified net. If congestion reduction program 300 determines that the identified tile is no longer congested (decision block 316, YES branch), then congestion reduction program 300 determines whether all congested tiles in the layout file have been processed (step 320) (discussed in further detail below).

If congestion reduction program 300 determines that the identified congested tile did not become uncongested (decision block 316, NO branch), then congestion reduction program 300 determines whether all nets in the identified congested tile have been processed (decision block 318). In the illustrative embodiment, congestion reduction program 300 maintains a list of all nets crossing the identified congested tile as determined in the congestion analysis executed on layout file 108 in step 302. In this embodiment, congestion reduction program 300 also maintains a list of nets that have been processed. By comparing the two lists, congestion reduction program 300 can determine if any nets appear on the list of nets generated by the congestion analysis that are not on the list of processed nets. If congestion reduction program 300 determines that not all of the nets in the identified congested tile have been processed (decision block 318, NO branch), then congestion reduction program 300 identifies a net crossing the congested tile with the greatest slack (Step 308).

If congestion reduction program 300 determines that all nets in the identified congested tile have been processed (decision block 318, YES branch), then congestion reduction program determines whether all congested tiles have been processed (decision block 320). In the illustrative embodiment, congestion reduction program 300 maintains a list of all congested tiles that have been processed. In this embodiment, congestion reduction program 300 compares the list of processed congested tiles with the list of congested tiles generated during the congestion analysis in step 302 to determine with any congested tiles are on the congestion analysis list but not on the list of processed congested tiles. If congestion reduction program 300 determines that all of the congested tiles have not been processed (decision block 320, NO branch), then congestion reduction program 300 identifies a congested tile (step 306). If congestion reduction program 300 determines that all of the congested tiles in the congestion analysis list have been processed, then congestion reduction program 300 terminates execution.

As discussed above, congestion reduction program 300 determines whether the modified net still has positive slack in decision block 314. If congestion reduction program 300 determines that the modified net does not have positive slack (decision block 314, NO branch), then congestion reduction program 300 identifies a subnet in an uncongested tile (step 322). In the illustrative embodiment, congestion reduction program 300 identifies a subnet of the identified net that lies in a tile that was determined to be uncongested in the congestion analysis of step 302. In this embodiment, congestion reduction program 300 scans the identified net progressively from the signal source to the signal sink until a subnet of the net is identified which lies in one or more uncongested tiles. In other embodiments, congestion reduction program 300 can use any means known in the art to identify a suitable subnet in an uncongested tile.

Congestion reduction program 300 modifies the identified subnet in the uncongested tile to increase the slack on the net (step 324). In the illustrative embodiment, congestion reduction program 300 modifies the net by increasing the wire-code of the identified subnet, promoting the identified subnet to a higher layer, or both. In this embodiment, increasing the modifying the identified subnet in the uncongested tile improves the signal transit time on the net while increasing the congestion in the identified uncongested tile. In other embodiments, congestion reduction program 300 can use any mechanism known in the art to increase the slack (i.e., decrease the signal transit time) on the identified net.

Congestion reduction program 300 determines whether the modified net has positive slack (decision block 326). In the illustrative embodiment, congestion reduction program 300 performs incremental timing analysis on the modified net in order to determine if the modified net meets the timing requirements of the IC design. In other embodiments, congestion reduction program 300 also performs incremental timing analysis on nets neighboring the modified net because the increase in wire-code and/or promotion of the subnet can have an adverse effect on the signal transit time for nearby nets. If congestion reduction program 300 determines that the modified net has positive slack (decision block 326, YES branch), then congestion reduction program 300 determines whether the congested tile became uncongested (decision block 316).

If congestion reduction program 300 determines that the modified net does not have positive slack (decision block 326, NO branch), then congestion reduction program 300 determines whether all subnets in uncongested tiles have been processed (decision block 328). In the illustrative embodiment, congestion reduction program 300 maintains a list of all subnets that make up the identified net. Congestion reduction program 300 iterates through and modifies each subnet in an uncongested tile until either the slack on the net becomes positive or all subnets have been processed. If congestion reduction program 300 determines that all subnets in uncongested tiles have been processed (decision block 328, YES branch), then congestion reduction program 300 determines whether the congested tile became uncongested (decision block 316). If congestion reduction program 300 determines that all subnets in uncongested tiles have not been processed (decision block 328, NO branch), then congestion reduction program 300 identifies a subnet in an uncongested tile (step 322). In this embodiment, each subnet identified in an uncongested file is a subnet that has not already been processed by congestion reduction program 300.

In the illustrative embodiment, congestion reduction program 300 iterates through each congested tile, beginning with the most congested and ending with the least congested, until no congested tiles exists within the IC described by layout file 108.

Figure 4:
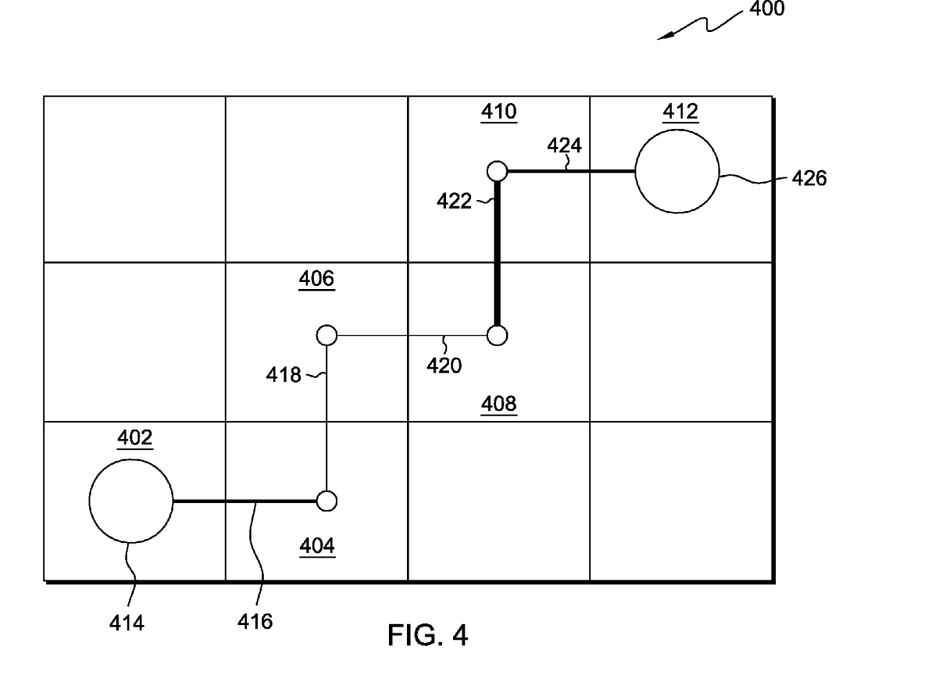
FIG. 4 is a block diagram depicting a layout view of a modified net of an integrated circuit design, in accordance with an embodiment of the present invention.

FIG. 4 is a block diagram depicting a layout view of a hypothetical modified net of an IC design, generally designated 400, in accordance with an example embodiment of the present invention. IC design 400 includes tiles 402, 404, 406, 408, 410, and 412. IC design 400 further includes signal source 414, signal sink 426, and subnets 416, 418, 420, 422, and 424, which combine to form a net that connects signal source 414 and signal sink 426. In this example, tile 406 is a congested tile. Tile 406 includes other components (not shown) and/or nets (not shown) which create a congested area within tile 406. Tiles 404, 408, and 410 are uncongested tiles through which the net passes. Congestion reduction program 106 identifies subnets 418 and 420 as subnets that pass through tile 406. Congestion reduction program 106 decreases the wire-code of subnets 418 and 420 in order to decrease the congestion in tile 406. The decreased wire-codes of subnets 418 and 420 are denoted by thinner line widths compared to other subnets in FIG. 4.

In this example, the decrease in wire-code of subnets 418 and 420 results in an increase in signal time for the signal from source 414 to traverse the net and arrive at sink 426. In order to compensate for the adverse effect on signal transit time, on the net, congestion reduction program 106 identifies subnet 422 as a subnet along the path of the net which lies entirely in uncongested tiles 408 and 410. In this example, congestion reduction program 106 increases the wire-code on subnet 422, as denoted by a thicker line width than other subnets in FIG. 4. The increase in the wire-code of subnet 422 decreases the time required for a signal to traverse the net from signal source 414 to signal sink 426 along the net and compensates for the wire-code decrease on subnets 418 and 420 to reduce the congestion in tile 406.

Figure 5:
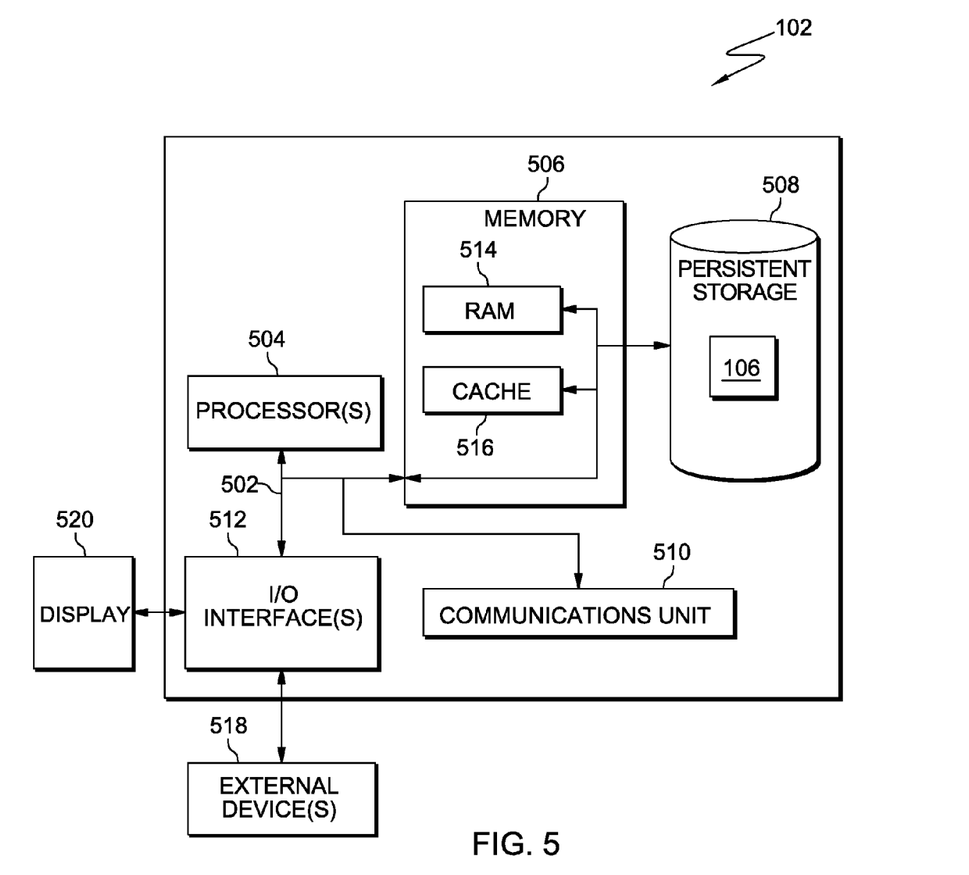
FIG. 5 depicts a block diagram of components of the computer executing the congestion reduction program, in accordance with an embodiment of the present invention.

FIG. 5 depicts a block diagram of components of computer 102 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computer 102 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Congestion reduction program 106 is stored in persistent storage 508 for access and/or execution by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Congestion reduction program 106 may be downloaded to persistent storage 508 through communications unit 510.

I/O interface(s) 512 allows for input and output of data with other devices that may be connected to computer 102. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., congestion reduction program 106, can be stored on such portable computer-readable storage media and can be loaded onto persistent storage 508 via I/O interface(s) 512. I/O interface(s) 512 also connect to a display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for reducing congestion in an integrated circuit design, the method comprising:
   identifying, by one or more computer processors, a first net, wherein the first net defines a path on one or more of a plurality of conducting layers in an integrated circuit and the first net has an associated signal transit time that depends, at least in part, on the path defined by the first net;
   identifying, by one or more computer processors, a first subnet of the first net in a congested area of the integrated circuit, wherein the first subnet of the first net has a first wire width and lies on a first conducting layer of the integrated circuit;
   modifying, by one or more computer processors, the first subnet of the first net, such that the congested area becomes less congested, wherein modifying the first subnet of the first net comprises decreasing the first wire width of the first subnet of the first net while keeping the first subnet of the first net in the first conducting layer;
   identifying, by one or more computer processors, a second subnet of the first net in an uncongested area of the integrated circuit, wherein the second subnet of the first net has a second wire width and lies on a second conducting layer of the integrated circuit;
   modifying, by one or more computer processors, the second subnet of the first net, such that the signal transit time of the first net decreases;
   identifying, by one or more computer processors, a second congested area of the integrated circuit design;
   identifying, by one or more computer processors, a second net that crosses the second congested area and has a greatest amount of positive slack of nets crossing the second congested area, wherein the second net defines a path from a signal source to a signal sink;
   modifying, by one or more computer processors, a first subnet of the second net to reduce slack on the second net;
   responsive to determining that after modifying the first subnet of the second net, the second net does not have positive slack, scanning, by one or more computer processors, the second net progressively from the signal source to the signal sink to identify a second subnet of the second net that lies in an uncongested area of the integrated circuit design;
   modifying, by one or more computer processors, the second subnet of the second net to increase slack on the second net; and
   responsive to determining that after modifying the second subnet of the second net, the second net does not have positive slack, iterating through and modifying each remaining subnet of the second net to increase slack on the second net until slack on the second net becomes positive or all subnets of the second net have been modified.

2. The method of claim 1, wherein modifying the first subnet of the first net such that the congested area becomes less congested comprises moving the first subnet of the first net from the first conducting layer to a third conducting layer, such that the signal transit time of the first net increases.

3. The method of claim 1, wherein modifying the second subnet of the first net such that the signal transit time of the net decreases comprises moving the second subnet of the first net from the second conducting layer to a fourth conducting layer.

4. The method of claim 1, wherein modifying the second subnet of the first net comprises increasing the wire width of the second subnet of the first net.

5. The method of claim 1, further comprising:
   performing, by one or more computer processors, a signal timing analysis on the first net in order to determine a value for the signal transit time of the first net;
   determining, by one or more computer processors, whether the value for the signal transit time of the first net is greater than a predetermined target value;
   responsive to determining that the value for the signal transit time of the first net is greater than a predetermined target value, identifying, by one or more computer processors, a third subnet of the first net in an uncongested area of the integrated circuit, wherein the third subnet of the first net has a third wire width and lies on a fifth conducting layer of the integrated circuit; and
   modifying, by one or more computer processors, the third subnet of the first net, such that the signal transit time of the first net decreases.

6. The method of claim 1, further comprising:
   determining, by one or more computer processors, a relative level of congestion between the congested area of the integrated circuit and an area on a third conducting layer; and
   determining, by one or more computer processors, whether to move the first subnet of the first net to a third conducting layer or to decrease the wire width of the first subnet of the first net based, at least in part, on the relative level of congestion between the congested area of the integrated circuit and the area on the third conducting layer.

7. A computer program product for reducing congestion in an integrated circuit design, the computer program product comprising:
  one or more computer-readable storage media and program instructions stored on the one or more computer-readable storage media, the program instructions comprising:
    program instructions to identify a first net, wherein the first net defines a path on one or more of a plurality of conducting layers in an integrated circuit and the first net has an associated signal transit time that depends, at least in part, on the path defined by the first net;
    program instructions to identify a first subnet of the first net in a congested area of the integrated circuit, wherein the first subnet of the first net has a first wire width and lies on a first conducting layer of the integrated circuit;
    program instructions to modify the first subnet of the first net, such that the congested area becomes less congested, wherein modifying the first subnet of the first net comprises decreasing the first wire width of the first subnet of the first net while keeping the first subnet of the first net in the first conducting layer;
    program instructions to identify a second subnet of the first net in an uncongested area of the integrated circuit, wherein the second subnet of the first net has a second wire width and lies on a second conducting layer of the integrated circuit;
    program instructions to modify the second subnet of the first net, such that the signal transit time of the first net decreases;
    program instructions to identify a second congested area of the integrated circuit design;
    program instructions to identify a second net that crosses the second congested area and has a greatest amount of positive slack of nets crossing the second congested area, wherein the second net defines a path from a signal source to a signal sink;
    program instructions to modify a first subnet of the second net to reduce slack on the second net;
    program instructions to, responsive to determining that after modifying the first subnet of the second net, the second net does not have positive slack, scan the second net progressively from the signal source to the signal sink to identify a second subnet of the second net that lies in an uncongested area of the integrated circuit design;
    program instructions to modify the second subnet of the second net to increase slack on the second net; and
    program instructions to, responsive to determining that after modifying the second subnet of the second net, the second net does not have positive slack, iterate through and modify each remaining subnet of the second net to increase slack on the second net until slack on the second net becomes positive or all subnets of the second net have been modified.

8. The computer program product of claim 7, wherein the program instructions to modify the first subnet of the first net such that the congested area becomes less congested comprise program instructions to move the first subnet of the first net from the first conducting layer to a third conducting layer, such that the signal transit time of the first net increases.

9. The computer program product of claim 7, wherein the program instructions to modify the second subnet of the first net such that the signal transit time of the first net decreases comprise program instructions to move the second subnet of the first net from the second conducting layer to a fourth conducting layer.

10. The computer program product of claim 7, wherein the program instructions to modify the second subnet of the first net comprise program instructions to increase the wire width of the second subnet of the first net.

11. The computer program product of claim 7, further comprising:
  program instructions stored on the one or more computer readable storage media to perform a signal timing analysis on the first net in order to determine a value for the signal transit time of the first net;
  program instructions stored on the one or more computer readable storage media to determine whether the value for the signal transit time of the first net is greater than a predetermined target value;
  program instructions stored on the one or more computer readable storage media to identify a third subnet of the first net in an uncongested area of the integrated circuit responsive to determining that the value for the signal transit time of the first net is greater than a predetermined target value, wherein the third subnet of the first net has a third wire width and lies on a fifth conducting layer of the integrated circuit; and
  program instructions stored on the one or more computer readable storage media to modify the third subnet of the first net, such that the signal transit time of the first net decreases.

12. The computer program product of claim 7, further comprising:
  program instructions stored on the one or more computer readable storage media to determine a relative level of congestion between the congested area of the integrated circuit and an area on a third conducting layer; and
  program instructions stored on the one or more computer readable storage media to determine whether to move the first subnet of the first net to a third conducting layer or to decrease the wire width of the first subnet of the first net based, at least in part, on the relative level of congestion between the congested area of the integrated circuit and the area on the third conducting layer.

13. A computer system for reducing congestion in an integrated circuit design, the computer system comprising:
  one or more computer processors;
  one or more computer-readable storage media;
  program instructions stored on the computer-readable storage media for execution by at least one of the one or more processors, the program instructions comprising:
    program instructions to identify a first net, wherein the first net defines a path on one or more of a plurality of conducting layers in an integrated circuit and the first net has an associated signal transit time that depends, at least in part, on the path defined by the first net;
    program instructions to identify a first subnet of the first net in a congested area of the integrated circuit, wherein the first subnet of the first net has a first wire width and lies on a first conducting layer of the integrated circuit;
    program instructions to modify the first subnet of the first net, such that the congested area becomes less congested, wherein modifying the first subnet of the first net comprises decreasing the first wire width of the first subnet of the first net while keeping the first subnet of the first net in the first conducting layer;

program instructions to identify a second subnet of the first net in an uncongested area of the integrated circuit, wherein the second subnet of the first net has a second wire width and lies on a second conducting layer of the integrated circuit;

program instructions to modify the second subnet of the first net, such that the signal transit time of the first net decreases;

program instructions to identify a second congested area of the integrated circuit design;

program instructions to identify a second net that crosses the second congested area and has a greatest amount of positive slack of nets crossing the second congested area, wherein the second net defines a path from a signal source to a signal sink;

program instructions to modify a first subnet of the second net to reduce slack on the second net;

program instructions to, responsive to determining that after modifying the first subnet of the second net, the second net does not have positive slack, scan the second net progressively from the signal source to the signal sink to identify a second subnet of the second net that lies in an uncongested area of the integrated circuit design;

program instructions to modify the second subnet of the second net to increase slack on the second net; and program instructions to, responsive to determining that after modifying the second subnet of the second net, the second net does not have positive slack, iterate through and modify each remaining subnet of the second net to increase slack on the second net until slack on the second net becomes positive or all subnets of the second net have been modified.

14. The computer system of claim 13, wherein the program instructions to modify the first subnet of the first net such that the congested area becomes less congested comprise program instructions to move the first subnet of the first net from the first conducting layer to a third conducting layer, such that the signal transit time of the first net increases.

15. The computer system of claim 13, wherein the program instructions to modify the second subnet of the first net such that the signal transit time of the first net decreases comprise program instructions to move the second subnet of the first net from the second conducting layer to a fourth conducting layer.

16. The computer system of claim 13, wherein the program instructions to modify the second subnet of the first net comprise program instructions to increase the wire width of the second subnet of the first net.

17. The computer system of claim 13, further comprising:

program instructions stored on the one or more computer readable storage media to perform a signal timing analysis on the first net in order to determine a value for the signal transit time of the first net;

program instructions stored on the one or more computer readable storage media to determine whether the value for the signal transit time of the first net is greater than a predetermined target value;

program instructions stored on the one or more computer readable storage media to identify a third subnet of the first net in an uncongested area of the integrated circuit responsive to determining that the value for the signal transit time of the first net is greater than a predetermined target value, wherein the third subnet of the first net has a third wire width and lies on a fifth conducting layer of the integrated circuit; and program instructions stored on the one or more computer readable storage media to modify the third subnet of the first net, such that the signal transit time of the first net decreases.

* * * * *